(12) United States Patent
Fanning et al.

(10) Patent No.: US 12,129,649 B2
(45) Date of Patent: *Oct. 29, 2024

(54) CASCADING ROOF WITH INTERDEPENDENT ROOF PANEL SECTIONS

(71) Applicant: TechnoGuard Inc., Sterling, VA (US)

(72) Inventors: Brian T. Fanning, Leesburg, VA (US); Joseph M. Lloyd, Ashburn, VA (US); Andre L. Johnson, Laurel, MD (US); Alfred B. Cook, Potomac Falls, VA (US)

(73) Assignee: TECHNOGUARD INC., Sterling, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,518

(22) Filed: May 30, 2023

(65) Prior Publication Data

US 2023/0304286 A1 Sep. 28, 2023

Related U.S. Application Data

(63) Continuation of application No. 17/528,939, filed on Nov. 17, 2021, now Pat. No. 11,692,349, which is a continuation of application No. 16/734,094, filed on Jan. 3, 2020, now Pat. No. 11,208,804.

(60) Provisional application No. 62/788,542, filed on Jan. 4, 2019.

(51) Int. Cl.
*E04B 7/16* (2006.01)
*E04B 1/346* (2006.01)
*E04H 5/02* (2006.01)
*E04H 5/00* (2006.01)

(52) U.S. Cl.
CPC .............. *E04B 7/163* (2013.01); *E04B 1/346* (2013.01); *E04H 5/02* (2013.01); *E04H 2005/005* (2013.01)

(58) Field of Classification Search
CPC . E04F 10/10; E06B 7/086; F24F 13/14; F24F 13/15; F24F 13/1606; F24F 13/075; F24F 13/08; F24F 13/10; H05K 7/20745; E04B 7/163; E04B 1/346; E04B 9/003; E04H 5/02; E04H 2005/005
USPC ......... 52/473; 49/82.1, 74.1, 92.1, 3.1, 80.1, 49/81.1, 90.1, 403; 454/358, 184
See application file for complete search history.

(56) References Cited

U.S. PATENT DOCUMENTS 3,219,101 A * 11/1965 Prehn ...................... E04F 10/10
160/206
4,527,355 A * 7/1985 Numakami ............. E04F 10/10
49/90.1
4,926,599 A * 5/1990 Scholz .................... E04F 10/10
49/90.1

(Continued)

*Primary Examiner* — Kyle J. Walraed-Sullivan
(74) *Attorney, Agent, or Firm* — Birch, Stewart, Kolasch & Birch, LLP (57) ABSTRACT

A roof system including a frame, a plurality of roof panels, wherein each roof panel is connected to the frame and is rotatable with respect to the frame, and a holding mechanism for holding a first roof panel among the plurality of roof panels in a closed position, wherein each roof panel among the plurality of roof panels overlaps at least one adjacent roof panel among the plurality of roof panels, and wherein release of the holding mechanism causes each of the roof panels to rotate toward an open position in a sequential manner.

20 Claims, 10 Drawing Sheets

(56) References Cited

U.S. PATENT DOCUMENTS

| | | | | |
|---|---|---|---|---|
| 5,484,185 | A | * | 1/1996 | Salz .................. B60J 7/047 |
| | | | | 296/217 |
| 5,862,633 | A | * | 1/1999 | Van Ells ................ F24F 5/00 |
| | | | | 135/117 |
| 9,657,475 | B1 | | 5/2017 | Steele |
| 2004/0148899 | A1 | * | 8/2004 | Pertile .................. E04F 10/10 |
| | | | | 52/581 |
| 2011/0271610 | A1 | | 11/2011 | Cottuli et al. |
| 2015/0092400 | A1 | | 4/2015 | Vincenzi |
| 2015/0376901 | A1 | * | 12/2015 | Partridge ............. E04B 9/001 |
| | | | | 52/64 |
| 2016/0115688 | A1 | * | 4/2016 | Weaver .............. E04D 13/064 |
| | | | | 49/82.1 |
| 2016/0177575 | A1 | * | 6/2016 | Ivic .................... E04F 10/08 |
| | | | | 52/302.1 |
| 2017/0121966 | A1 | * | 5/2017 | Jiang ................ E04B 9/0464 |
| 2019/0323232 | A1 | * | 10/2019 | Mitchell .............. E04B 7/163 |
| 2019/0338528 | A1 | * | 11/2019 | Torman ............... E04F 10/10 |

* cited by examiner

CASCADING ROOF WITH INTERDEPENDENT ROOF PANEL SECTIONS

CROSS-REFERENCE TO RELATED APPLICATIONS

This application is a continuation of U.S. application Ser. No. 17/528,939, filed on Nov. 17, 2021, which is a continuation of U.S. application Ser. No. 16/734,094, filed Jan. 3, 2020 (now U.S. Pat. No. 11,208,804 issued on Dec. 28, 2021), which claims priority under 35 U.S.C. § 119(e) to U.S. Provisional Application No. 62/788,542, filed Jan. 4, 2019, the disclosures of which are incorporated herein by reference in their entirety.

BACKGROUND OF THE INVENTION

Field of Invention

The present invention relates to the field of airflow control/blockage pertaining to data center hot and cold aisle separation through the use of containment (physical structures of walls, doors, roofs and blanking panels, for example).

Description of Related Art

With the fast growing data center market and massive power consumption associated with its infrastructure, the need to conserve resources is of utmost importance. Separating data centers into hot aisles and cold aisles by use of containment, vastly increases cooling capacities and provides significant energy saving benefits. The energy savings directly correlates to the quality of separation between the hot aisles and the cold aisles.

It is known that data centers include a computer room having a plurality of server cabinets housing servers, and that the servers generate waste heat. To facilitate the cooling of the servers, some data centers include a Cold Aisle Containment (CAC) surrounding and sealing the intake side of one or more server cabinets, in which cooled air, such as air conditioned air (air may be conditioned by an air conditioner), is introduced into the CAC through a perforated floor (or otherwise a floor having a ducting of some sort).

The cooled air passes through the servers by entering the intake side of the one or more server cabinets to an exhaust side of the one or more server cabinets to cool the servers (i.e., from inside the CAC to outside the CAC). The exhaust side of the server cabinet(s) can be connected to a Hot Aisle Containment (HAC), which is a sealed enclosure for directing the waste heat produced by the servers back into the air conditioner, which can then be re-introduced into the CAC.

A CAC is typically comprised of doors provided at respective ends of a row of server cabinets (i.e., end of row or end-of-aisle doors) and a roof system, each of which contribute to the trapping of conditioned air coming up from a subfloor. The floor which may have a pressurized subfloor (by conditioned air), may have perforations located on the intake side between two rows of server cabinets. The conditioned air is thus available (instead of blowing up and out of the aisle) to be pulled through the servers by their internal fans.

The CAC roof system is typically suspended from the facility's ceiling structure, such as by wire, rope, or the like, or is supported on a top surface of the server cabinets. To comply with Fire Marshall Regulations, there may be situations in which a CAC roof must work in conjunction with the facility's fire suppression system, such as a sprinkler system. To comply with the regulations, the CAC roof system may be designed to open when an electrical signal is received from a smoke or fire detection system, thus providing an open area allowing for the fire suppression system to suppress a fire within the area enclosed by the CAC.

U.S. Pat. No. 9,198,310, herein "Eichelberg," and U.S. Pat. No. 10,327,360, herein "Fanning," are being incorporated by reference in their entirety to disclose a data center, hot aisles and cold aisles. For instance, Eichelberg discloses, in FIG. 1, a hot aisle containment system with a stall containment of racks, including a data center 100 having a computing room 102, rack computing systems 104 in rack row 106, hot aisle containment system 108, and air moving devices 110 including exhaust fans (Eichelberg, column 4, lines 56-60). Fanning describes a data center including air blocking devices provided around the server rack cabinets (Fanning column 2, lines 15-42).

SUMMARY OF THE INVENTION

An embodiment of the present invention is directed to a CAC roof system including interdependent, simultaneous releasing roof panels.

The roof panels are attached to a perimeter frame, such as a perimeter track surrounding a perimeter of all of the roof panels. The roof panels may be attached to the perimeter frame by a pin or a bracket including fastenings, but the attachment between the roof panels and the perimeter frame is not limited to such as a connection. When in their closed positions, each roof panel abuts against at least one adjacent roof panel, and each roof panel overlaps or is overlapped by each of the at least one adjacent roof panels. A first roof panel (or hold/release roof panel) located at a first end (or hold/release end) of the roof system may be held in its closed position by a hold/release mechanism, and a final roof panel (or stop roof panel) located at a second end (or stop end) of the roof system opposite to the first end may rest against a stop, such as a surface of the perimeter frame.

The hold/release mechanism may be a remote/manual pin, one or more magnets, a manual lever, or a user's hand, and may be provided at a first end of the perimeter frame for holding a first roof panel. The final roof panel may rest against a surface a second side of the perimeter frame, when in its closed position. The first roof panel may overlap a second roof panel (or alternatively may be overlapped by the second roof panel), which is directly adjacent to the first roof panel, and the first roof panel may rest on a surface of the second roof panel, such as a top surface of the second roof panel, to be held in its closed position. That is, the first roof panel overlaps and contacts a portion of the second roof panel to hold the second roof panel in its closed position.

The second roof panel may be overlapped by the first roof panel and a third roof panel (or alternatively the second roof panel may overlap the first roof panel and the third roof panel), the third roof panel being directly adjacent to the second roof panel, and the third roof panel may rest on the second roof panel, which holds the third roof panel in its closed position. That is, the roof panels may be alternatively arranged such that upon release of a first roof panel, each of the roof panels release in a cascading motion (i.e., cascading manner).

The cascading manner is described below. In response to a signal (such as a fire alarm), manual intervention, an emergency release (electrical or mechanism) or the like to release the hold/release mechanism, the first roof panel releases and rotates about the perimeter frame. Since the second roof panel is held in its closed position by the first roof panel, release of the first roof panel causes a release of the second roof panel. Further, since the third roof panel is held in its closed position by the second roof panel, release of the second roof panel causes release of the third roof panel. Further, if additional roof panels are used in the roof system, each additional roof panel is subsequently released by the release of a directly adjacent panel, first caused by the release of the first roof panel released by the hold/release mechanism.

The release of the roof panels may include rotation of the panel such that the panel is substantially perpendicular to the floor, thus allowing, for example, water from a sprinkler system to enter into the CAC or HAC to suppress a fire hazard, smoke, excess generated heat, or any other hazard.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will now be described with reference to the accompanying drawings, wherein the same reference numerals have been used to identify the same or similar elements throughout the several views.

Figure 1:
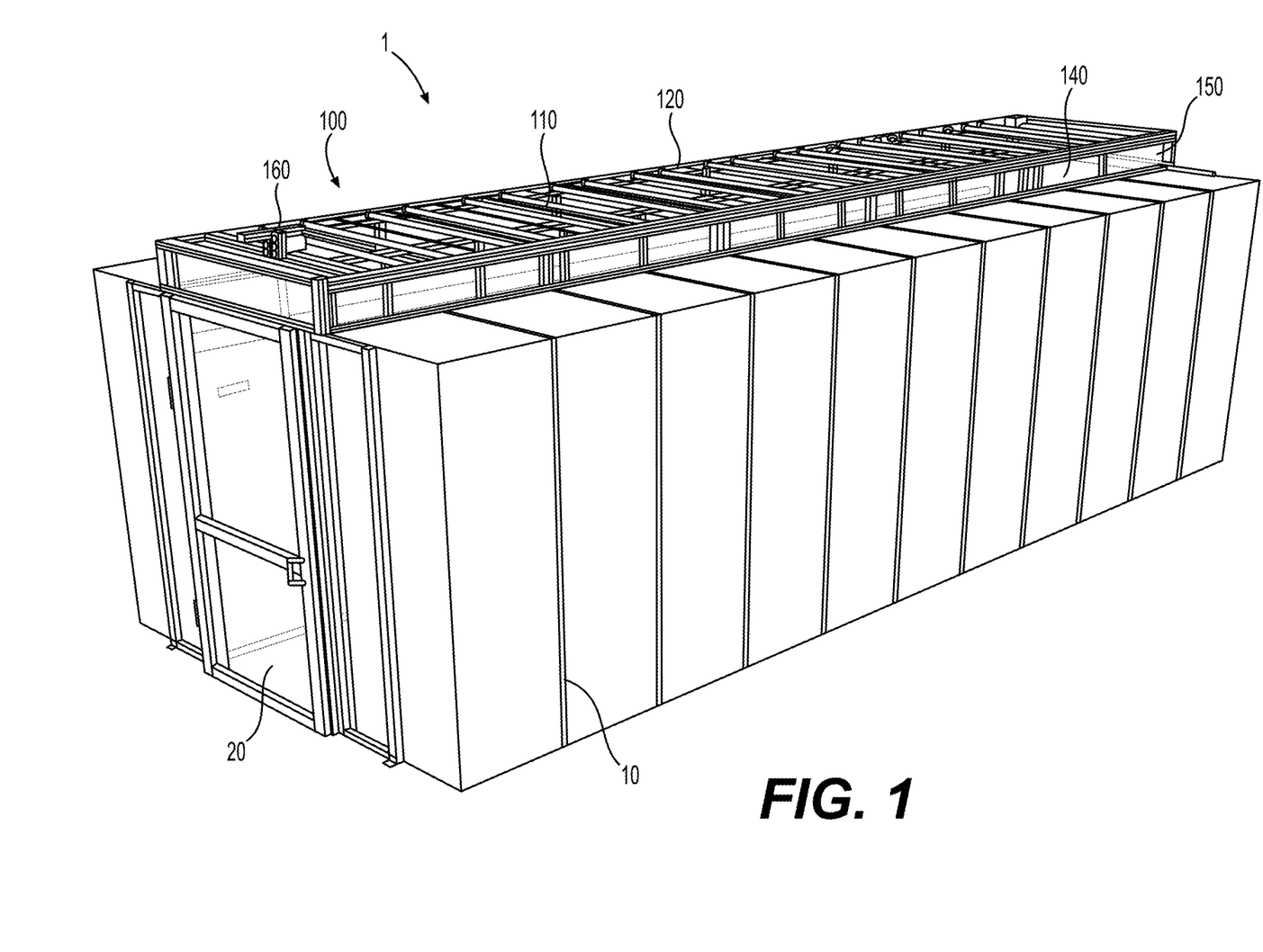
FIG. 1 illustrates a CAC system of the present invention, including a roof system, server cabinets and end-of-aisle doors.

FIG. 1 of the present invention illustrates a CAC system 1 of a data center, including a CAC roof system 100, a plurality of server cabinets 10 and end-of-aisle doors 20. The roof system 100 includes perimeter frame 110, a plurality of roof panels 120, a riser panel frame (i.e., side panel frame) 140 and riser panels (i.e., side panels) 150. Additionally, the CAC system 1 of the data center may include a hold/release mechanism 160, described in detail below.

The CAC system 1 may be provided in a data center including a plurality of CAC systems 1 and HAC systems adjacent to each CAC system 1. The HAC system may receive air heated by the servers of the server cabinets 10 and may direct the heated air to an air conditioning system to cool the heated air, and the cooled air may be re-introduced into the corresponding CAC systems 1.

The roof system 100 may rest on the plurality of server cabinets 10 and may create a seal with the server cabinets. Further the end-of-aisle doors 20 may create a seal with the server cabinets 10.

Alternatively, the roof system 100 may be suspended from a ceiling of the data center. For example, the roof system 100 may be suspended from a ceiling of the data center by cables, ropes, metal frames, or the like.

The roof system 100 includes interdependent, simultaneous releasing roof panels 120. The roof panels 120 are attached to the perimeter frame 110, such as a perimeter track surrounding a perimeter of all of the roof panels 120.

Figure 2:
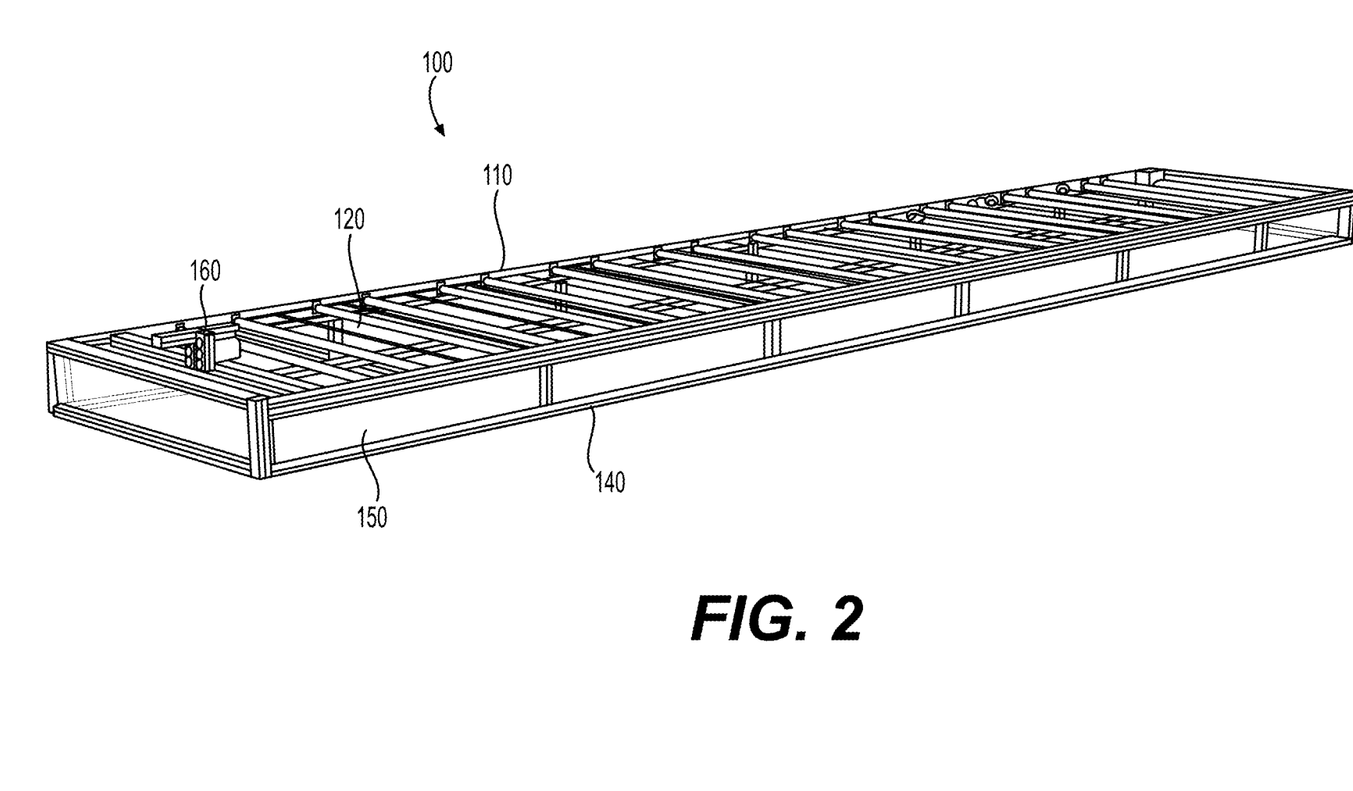
FIG. 2 illustrates a roof system of the present invention, including optional riser panels.

FIG. 2 of the present invention illustrates the roof system 100 including a perimeter frame 110, a plurality of roof panels 120 attached to the perimeter frame 110, a riser frame 140 connected to the perimeter frame 110, and a plurality of riser panels 150. The riser frame 140 may extend downward from the perimeter frame 110 towards the server cabinets 10. Further, the riser frame 140 may rest directly on corresponding server cabinets 10 to create a seal between the roof system 100 and the server cabinets 10 to ensure conditioned air does not leak past the roof system 100, as illustrated in FIG. 1.

Alternatively, the riser panels 150 may be replaced with a wiper element, such as a flexible rubber or fiberglass material attached to the perimeter frame 110 and extending from the perimeter frame 110 to the server cabinets 10, to create a seal between the perimeter frame 110 and the server cabinets 10. The wiper element can be any known element, including rubber, silicon, plastic, fiberglass and a combination thereof, and is not limited thereto. Further, the wiper element may be made of a fireproof or fire resistant material.

Figure 13:
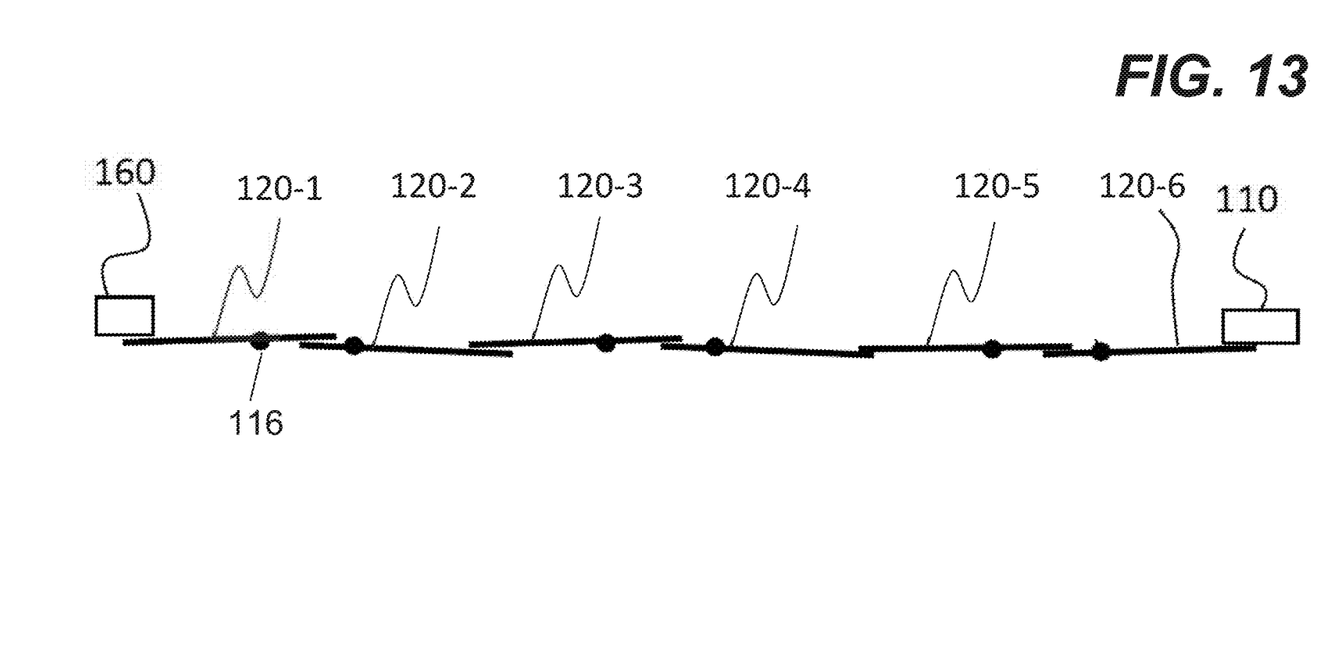
FIG. 13 is a cross-sectional view showing six roof panels overlapping in their closed positions.
Figure 14:
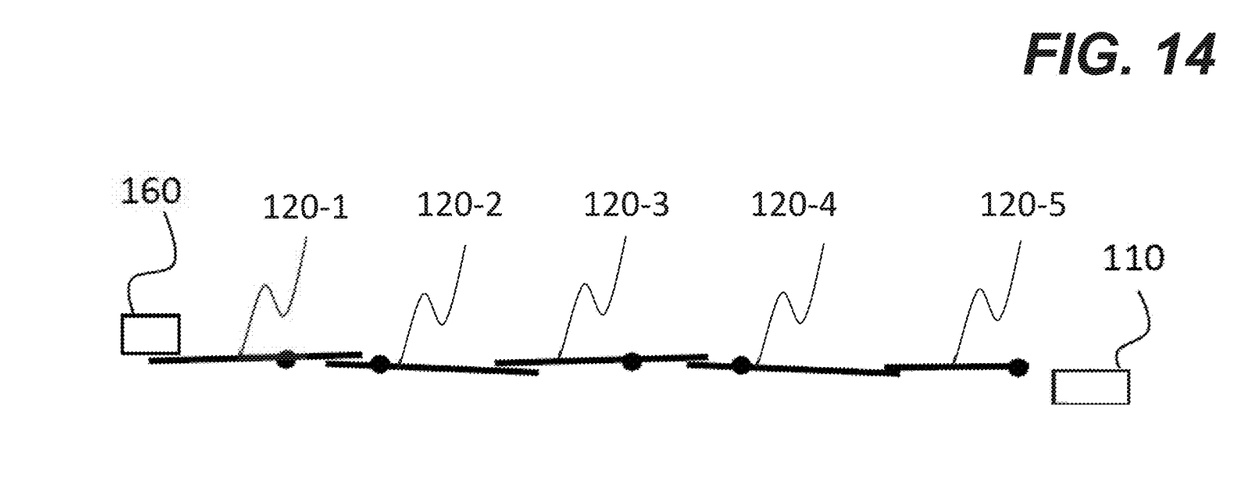
FIG. 14 is a cross-sectional view showing five roof panels overlapping in their closed positions.
Figure 15:
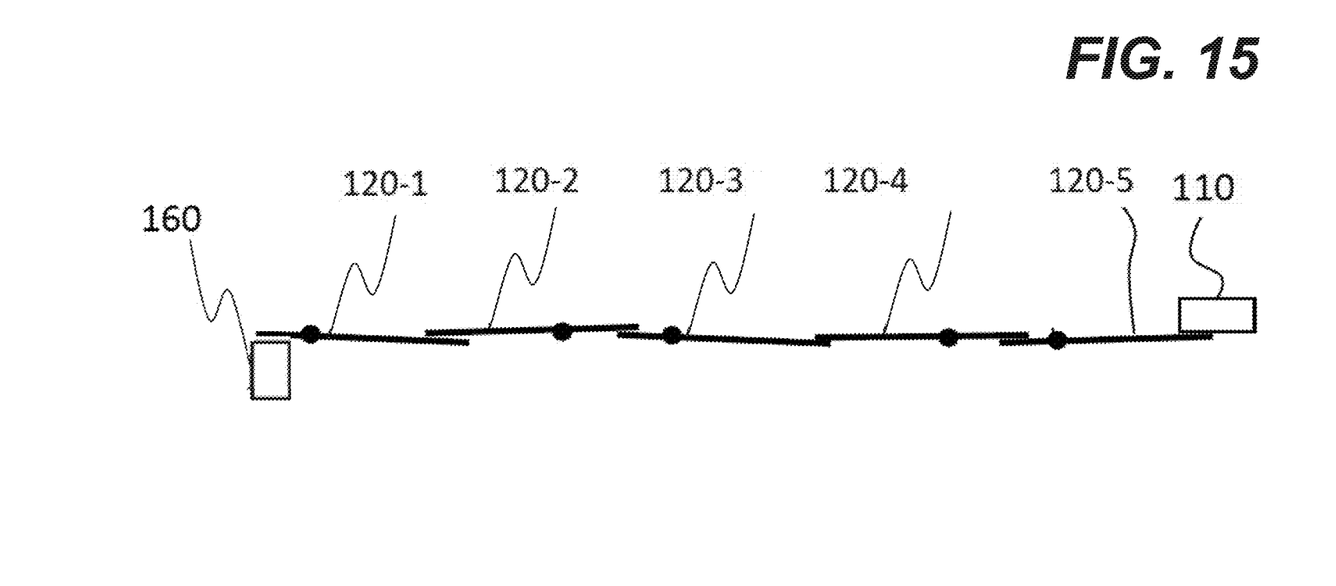
FIG. 15 is a cross-sectional view showing an alternative arrangement of the hold/release mechanism and roof panels in their closed positions.

A stop is provided at a second end of the perimeter frame 110, such as a second longitudinal end of the perimeter frame 110, that prevents a final roof panel 120 (stop roof panel) such as a sixth roof panel 120-6 in FIG. 13, from over rotating. FIG. 13 shows a sixth roof panel 120-6 resting against the perimeter frame 110, where the perimeter frame 110 is the stop. The stop may be a protruding member of the perimeter frame 110, a separate component from the perimeter frame 110, may be a top surface of the perimeter frame 110 as shown in FIG. 14, may be a bottom surface of the perimeter frame 110 as shown in FIGS. 13 and 15, or may be another surface of the perimeter frame 110.

The hold/release mechanism 160 may be provided at a first end of the perimeter frame 110, such as a first longitudinal end. The hold/release mechanism 160 may hold a first roof panel 120-1 (hold/release roof panel) in its closed position. Each roof panel 120, in its closed position, is substantially parallel to a floor of the data center. The first roof panel 120-1 may hold an adjacent roof panel in its closed position, and each subsequent roof panel 120 may hold an adjacent roof panel 120 in its closed position. Therefore, the hold/release mechanism 160 may maintain or hold all of the roof panels 120 in its closed position by directly maintaining the first roof panel 120-1 in its closed position. Each roof panel 120 seals against the perimeter frame 110, or at an interior peripheral surface of the perimeter frame 110, and against at least one adjacent roof panel 120 to seal the CAC system 1, thereby improving the efficiency of the CAC system 1.

The roof system 100 may include only a single hold/release mechanism 160. The hold/release mechanism 160 may maintain all of the roof panels 120 of the roof system 100 in their closed position by directly contacting and holding the first roof panel 120-1 in its closed position.

The present invention can release each of the roof panels 120 by the single (i.e., only one) hold/release mechanism 160, thereby reducing the need for a separate hold/release mechanism 160 for each roof panel 120. The present invention accomplishes the release of each of the roof panels 120 due to the alternating arrangement of the roof panels 120, which are released in a cascading manner, as described in detail below. Thus, the present invention provides a simpler and more reliable CAC roof system than existing CAC roof systems, which are known to require separate hold/release mechanisms for each roof panel 120.

The hold/release mechanism 160 may be a remote/manual pin, one or more magnets, such as an electromagnet, a manual lever, a fusible link, or a user's hand. A fusible link may be used in installations that do not have a fire detection system, to hold the first roof panel 120-1 in its closed position until the fusible link breaks in the event of a fire in order to release the first roof panel 120-1. The magnet of the hold/release mechanism 160 may be an electromagnet, which is a type of magnet whose magnetic field is provided by an electric current. The electromagnet may be connected to a power source, such as AC power or DC power, in a manner known in the art. Further, the electromagnet may further be connected to an alarm, such as a fire alarm or smoke alarm. In response to activation of the alarm, an electrical circuit of the electromagnet may be opened, thus stopping electrical current through the electromagnet 160 and causing the electromagnet to deactivate and release a connection with the first roof panel 120-1 by losing its magnetic properties.

That is, the hold/release mechanism 160 may be an electromagnet and the first roof panel 120-1 may include a first portion held by the hold/release mechanism 160, such as a metallic portion. However, a material of the first portion of the first roof panel 120-1 is not limited thereto. The first portion of the first roof panel 120-1 may be held to the hold/release mechanism 160 by magnetism, or alternatively by gravity in the case when the hold/release mechanism 160 is a lever, a pin, or the like. Upon release of the hold/release mechanism 160, the first roof panel 120-1 may release from the hold/release mechanism 160 and rotate with respect to the perimeter frame 110 to an opened position (i.e., perpendicular to a plane of the perimeter frame 110 and perpendicular to a plane of a floor of the data center). Each roof panel 120 may have a center of mass offset from a center of rotation to rotate upon being released from the hold/release mechanism 160.

Figure 3:
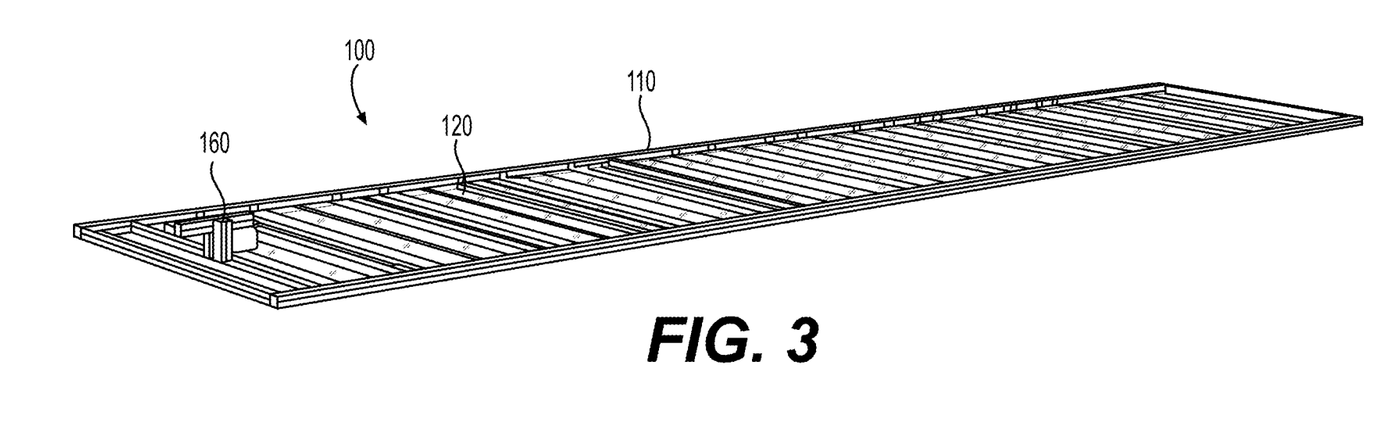
FIG. 3 illustrates a roof system in its closed position, including a perimeter frame, a hold/release mechanism and roof panels.

FIG. 3 of the present invention illustrates the roof system 100 without a riser frame 140 and without riser panels 150, with roof panels 120 alternatively arranged and in their closed positions. The roof system 100 of FIG. 3 further includes the hold/release mechanism 160. In this instance, the hold/release mechanism 160 may be an electromagnet that is activated to hold a first roof panel 120-1 among the roof panels 120, in its closed position. For instance, the first roof panel 120-1 may include a magnet or may comprise iron, such that the hold/release mechanism 160 may be magnetically attracted to the first roof panel 120-1 to maintain the first roof panel 120-1 in its closed position.

Figure 4:
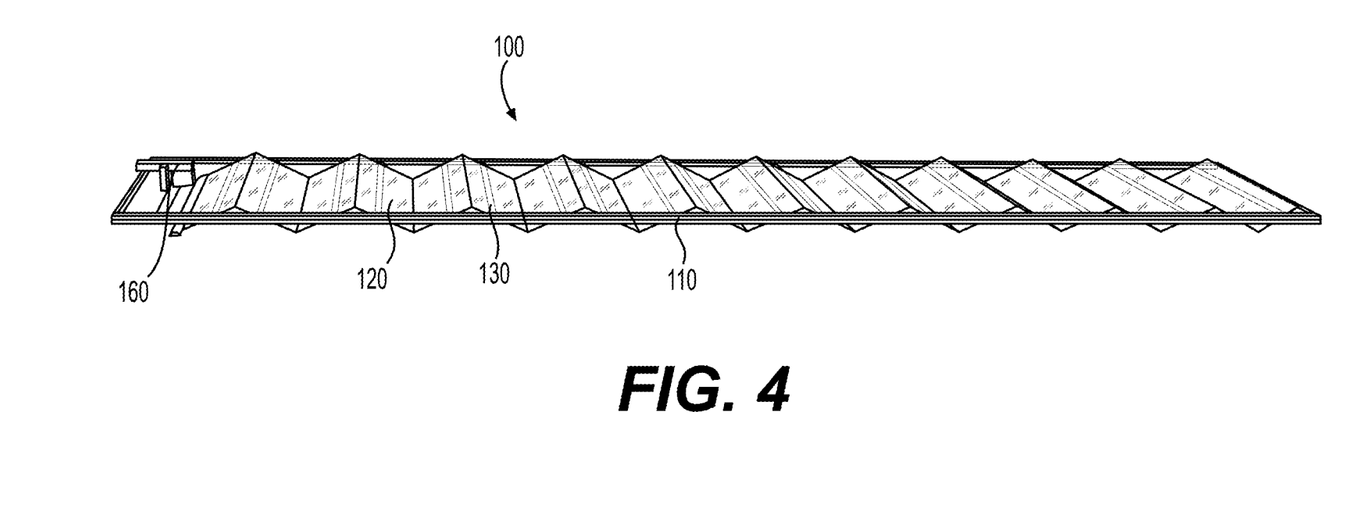
FIG. 4 illustrates the roof system at a first time period after a release of the hold/release mechanism.

FIG. 4 of the present invention illustrates the roof system of FIG. 3 at a first time period after the hold/release mechanism 160 is released, and the roof panels 120 are shown as being partially opened. For instance, the roof panels may be opened at substantially 25 degrees relative to a plane of the perimeter frame 110.

Each roof panel 120 may have a center of mass offset from a center of rotation about a pivot point by having a first side of the roof panel 120 spaced from the center of rotation that is heavier than a second side of the roof panel 120 spaced from the center of rotation in the opposite direction. The first side of each roof panel 120 may be opposite to the respective second side of the roof panel 120. The first side of the roof panel 120 may be heavier by extending further from the center of rotation than the respective second side of the roof panel 120. The first side of the roof panel 120 may alternatively be provided with a weight to be heavier than the respective second side of the roof panel 120. Further, the second side of the roof panel 120 may be provided with holes, such as drill holes, such that the second side of the roof panel 120 is lighter (i.e., weighs less) than the first side of the roof panel 120. Further, the first side of the roof panel 120 may have a higher density than the respective second side of the roof panel 120. However, the present invention is not limited to the above, and each roof panel 120 may have any structure, material or shape to cause its center of mass to be offset from its center of rotation to allow for rotation upon release of the hold/release mechanism 160.

In their closed positions, the roof panels 120 may be arranged such that the heavy sides (i.e., side of the panel where the center of mass is located) of adjacent roof panels 120 may overlap and contact one another, and the light sides (i.e., side of the panel opposite to the side where the center of mass is located) of adjacent roof panels 120 may overlap and contact one another, as illustrated in FIGS. 13-15. For instance, FIG. 13 shows each roof panel 120 having a first side (a heavy side), as defined with respect to the rotation member 116, having a length greater than a second side (a light side) opposite to the first side.

Starting from a sixth roof panel 120-6 that contacts the perimeter frame 110 (i.e., the right-most panel 120 of FIG. 13) at a first side thereof, a second side of the sixth roof panel 120-6 is overlapped by a second side of a fifth roof panel 120-5, a first side of the fifth roof panel 120-5 overlaps a first side of an adjacent fourth roof panel 120-4, and a second side of the fourth roof panel 120-4 is overlapped by a second side of an adjacent third roof panel 120-3, a first side of the third roof panel 120-3 overlaps a first side of an adjacent second roof panel 120-2, and a second side of the second roof panel 120-2 is overlapped by a second side of an adjacent first roof panel 120-1. The present invention is not limited to six roof panels 120, and may include any number of roof panels 120. The first side of the first roof panel 120-1 is held in its closed position by the hold/release mechanism 160.

It is noted that FIG. 13 is illustrative of the overlapping configuration of the roof panels 120, however, the roof panels may be alternatively arranged such that their first side is switched with their second side. For example, as shown in FIG. 15, a second side of a fifth roof panel 120-5 is overlapped by a second side of an adjacent fourth roof panel 120-4, and a first side of the fourth roof panel 120-4 overlaps a first side of an adjacent third roof panel 120-3, a second side of the third roof panel 120-3 is overlapped by a second side of an adjacent second roof panel 120-2, and a first side of the second roof panel 120-2 overlaps a first side of an adjacent first roof panel 120-1.

FIG. 4 illustrates the process of the roof panels 120 opening, however, the roof panels 120 may instead open in a cascading member. That is, the first roof panel 120-1 (i.e., the roof panel 120 held by the hold/release mechanism 160), may be rotated first (i.e., opened) by the release of the hold/release mechanism 160, which causes the rotation (and therefore opening) of a second roof panel 120-2 directly adjacent to the first roof panel 120-1, and the second roof panel 120-2 may cause the release of a third roof panel 120-3, directly adjacent to the second roof panel 120-2, and so on for any number of roof panels 120 necessary to for the roof system 100 to occupy one or more server cabinets 10. Therefore, the particular angles of the individual roof panels 120 with respect to one another may be different during the opening process, as the cascading opening motion travels from the first end of the perimeter frame 110 toward the second end of the perimeter frame 110 until all roof panels 120 reach their final opened positions.

Figure 5:
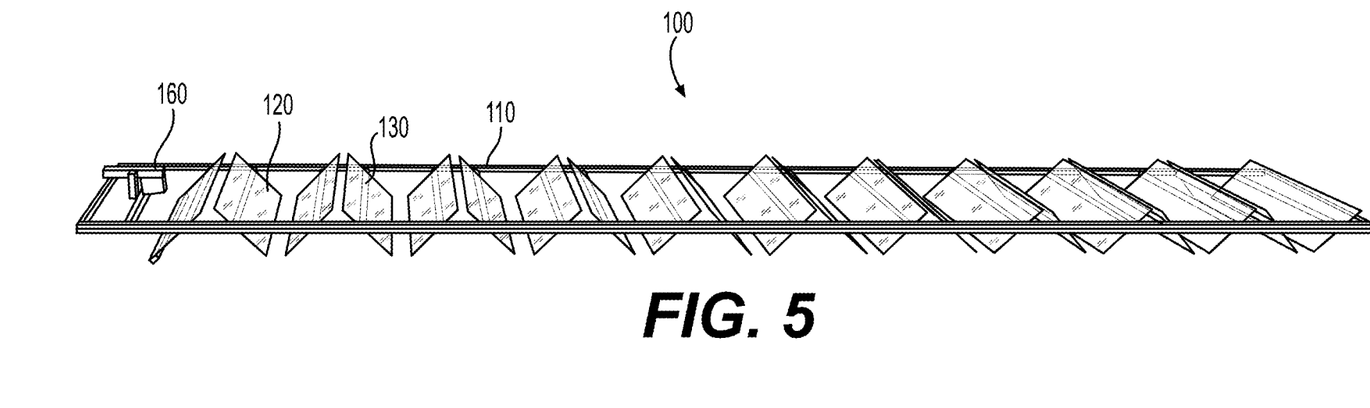
FIG. 5 illustrates the roof system of FIGS. 3 and 4 at a second time period after a release of the hold/release mechanism.

FIG. 5 of the present invention illustrates the roof system of FIGS. 3 and 4 at a second time period after the hold/release mechanism 160 is released, and the roof panels 120 are shown as being further opened. The second time period is greater than the first time period. For instance, the roof panels may be opened at substantially 45 degrees relative to the plane of the perimeter frame 110.

Figure 6:
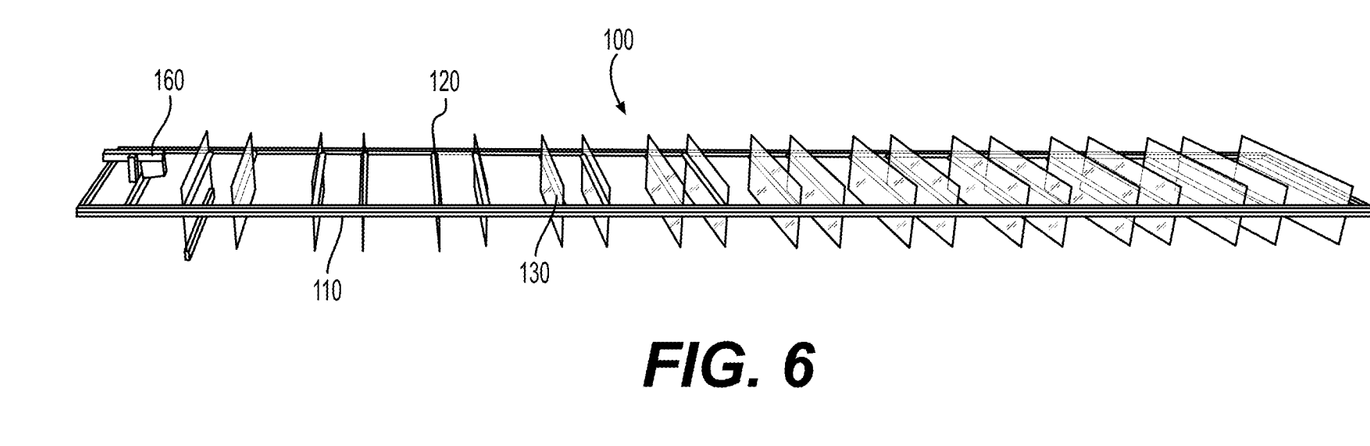
FIG. 6 illustrates the roof system of FIGS. 3-5, at a third time period after a release of the hold/release mechanism, where the roof panels are in their fully open position.

FIG. 6 of the present invention illustrates the roof system of FIGS. 3-5 at a third time period after the hold/release mechanism 160 is released, and the roof panels 120 are shown as being fully opened. The third time period is greater than the second time period. For instance, the roof panels 120 may be opened equal to or substantially at 90 degrees relative to the plane of the perimeter frame 110.

Figure 7:
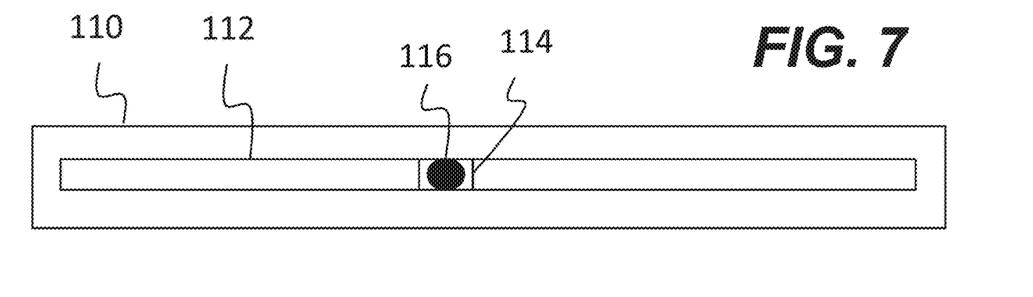
FIG. 7 illustrates an embodiment of a cross-section of the perimeter frame, including the connection between each roof panel and the perimeter frame.

FIG. 7 illustrates a cross section of the perimeter frame 110, the perimeter frame 110 including a channel 112 and two vertical members to form a groove 114 for encompassing (i.e., housing) a pivot connection between each roof panel 120 and the perimeter frame 110. For instance, the portion of the perimeter frame 110 shown in FIGS. 7-9 may be a side rail.

Figure 8:
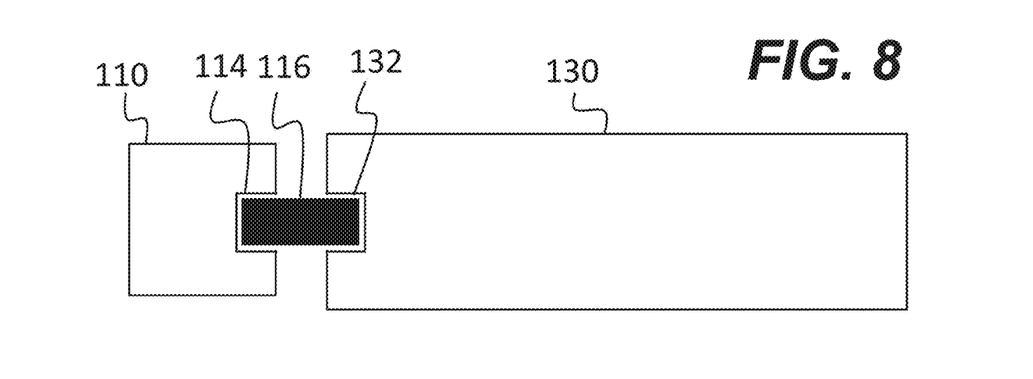
FIG. 8 illustrates an embodiment of the connection between the roof panel and the perimeter frame.
Figure 9:
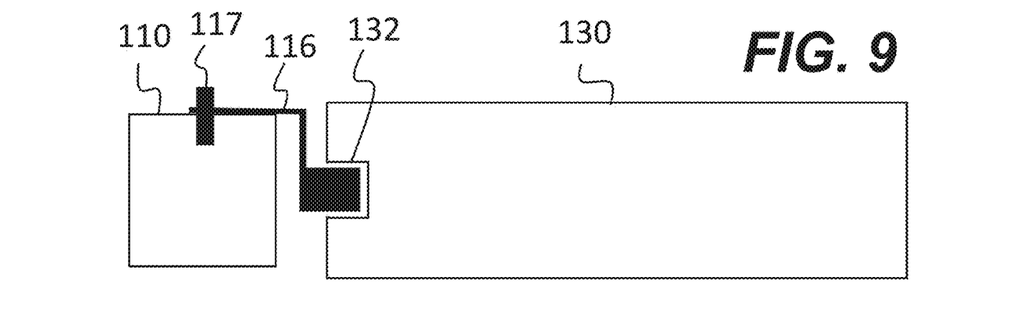
FIG. 9 illustrates another embodiment of the connection between the roof panel and the perimeter frame.

FIGS. 7-9 illustrate a first connection among two connections between the roof panel 120 or a cross-member 130 and the perimeter frame 110. The second connection between the roof panel 120 or the cross-member 130 and the perimeter frame 110 is the same as the first connection.

That is, each roof panel 120 may be connected to the perimeter frame 110 by a rotation member 116. The rotation member 116 may be a pin, an L-shaped member, a bearing, a lever, or any other known component.

Each rotation member 116 may be directly connected to a roof panel 120, when the roof panel 120 is provided without a cross-member 130, or may be directly connected to the cross-member 130 of the roof panel 120. For illustration purposes, FIGS. 8-9 show a cross-member 130 being connected to the perimeter frame 110, however, the cross-member 130 may be replaced by the roof panel 120.

Each roof panel 120 may be of variable thickness, including having a thickness necessary to obviate the need for a cross-member 130. Alternatively, each roof panel 120 may comprise any known material, such as metal, plastic, ceramic, to obviate the need for a cross-member 130.

FIG. 8 illustrates a side view of connection between the perimeter frame 110 and a cross-member 130. The perimeter frame 110 may include the groove 114 for housing/receiving a first end of the rotation member 116, and the cross-member 130 (or alternatively the roof panel 120 itself) may include a corresponding groove 132 for housing and receiving a second end of the rotation member 116, opposite to the first end of the rotation member 116. The roof panel 120 may be rotatable about the rotation member 116.

FIG. 9 is an alternative embodiment of the connection between the cross-member 130 (or alternatively the roof panel 120 itself) and the perimeter frame 110. In FIG. 9, the rotation member 116 is fastened to a top surface of the perimeter frame 110 by a fastener 117 and forms an "L" shape to protrude into the groove 132 of the cross-member 130 (or alternatively the roof panel 120 itself). The cross-member 130, and thus the corresponding panel 120, may be rotatable about rotation member 116 fixed to the perimeter frame 110. The fastener 117 may be a nail, a threaded fastener, such as a screw or bolt, or any other known fastener type.

Figure 10:
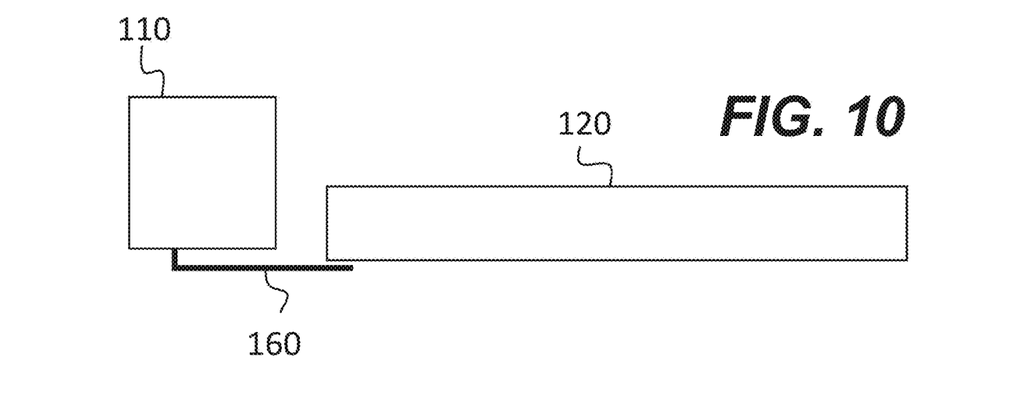
FIG. 10 illustrates a hold/release mechanism holding a roof panel of the roof system.

FIG. 10 illustrates a hold/release mechanism 160 in the form of a lever that is attached to the perimeter frame 110 and holds a first roof panel 120-1 in its closed position. That is, the first roof panel 120-1 is held against the lever 160 by the gravitational force. The lever 160 may rotate about the perimeter frame 110 to allow for the release of the first roof panel 120-1.

In an alternative embodiment, as illustrated in FIGS. 1-6, when the hold/release mechanism 160 is an electromagnet, the hold/release mechanism 160 may be positioned directly above (i.e., overlapping) a portion of the first roof panel 120-1 to be magnetically attracted to the first portion of the first roof panel 120-1, as illustrated in FIG. 13.

Figure 11:
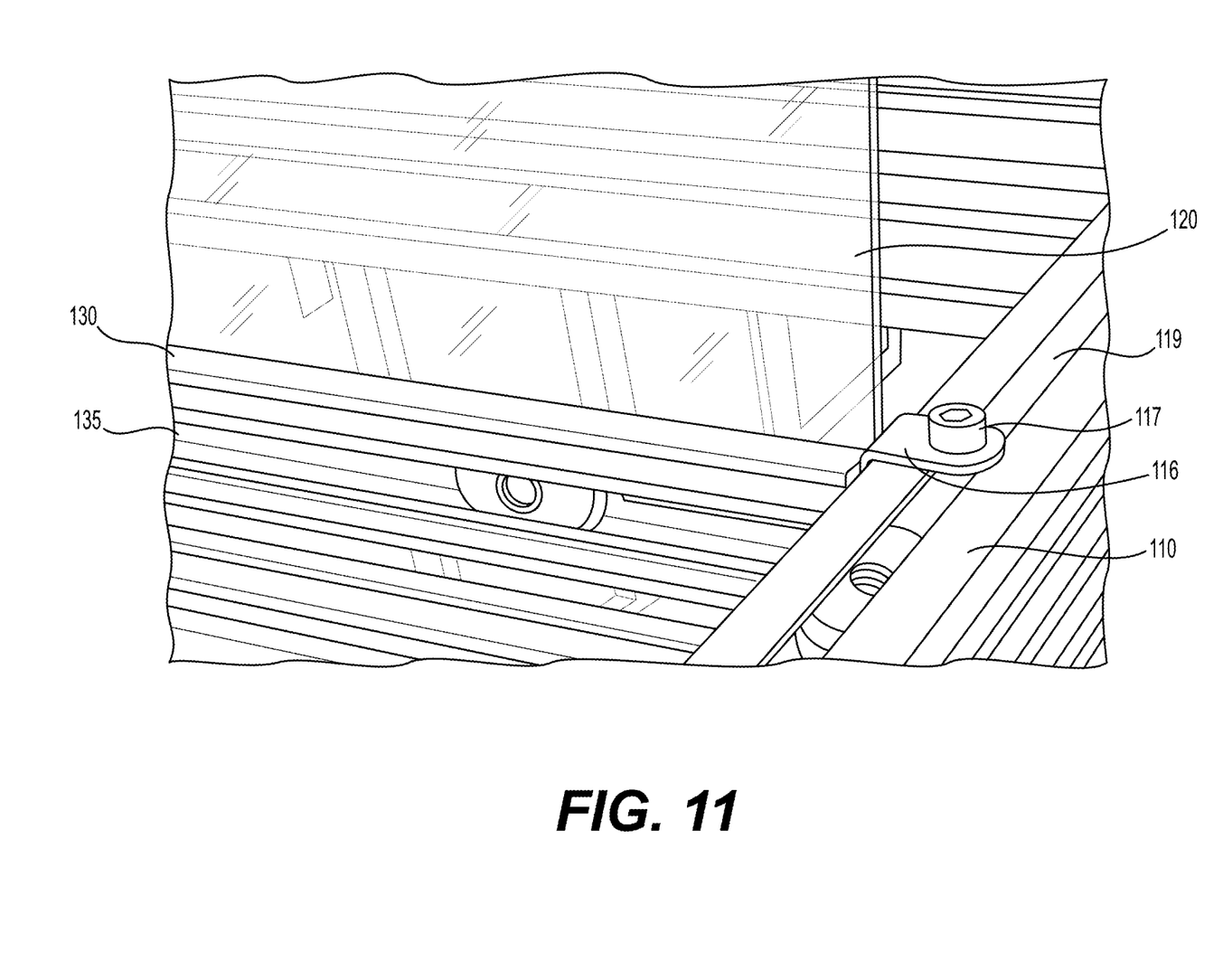
FIG. 11 illustrates a top-perspective view of the connection between the roof panel and the perimeter frame of FIG. 8.

FIG. 11 is a perspective view showing the connection between the cross-member 130 and the perimeter frame 110 of FIG. 9. That is, FIG. 11 shows a fastener 117 for connecting the "L" shaped rotation member 116 to the perimeter frame 110, and shows the cross-member 130 attached to a roof panel 120, the roof panel 120 being in an opened position to expose the groove 135 of the cross-member 130. Further, FIG. 11 shows that the perimeter frame 110 may be provided with a top surface channel 119 for receiving the fastener 117. However, the present invention is not limited thereto, and the perimeter frame 110 may be provided without the channel 119, and the fastener 117 may engage a threaded hole of the perimeter frame 110.

Figure 12:
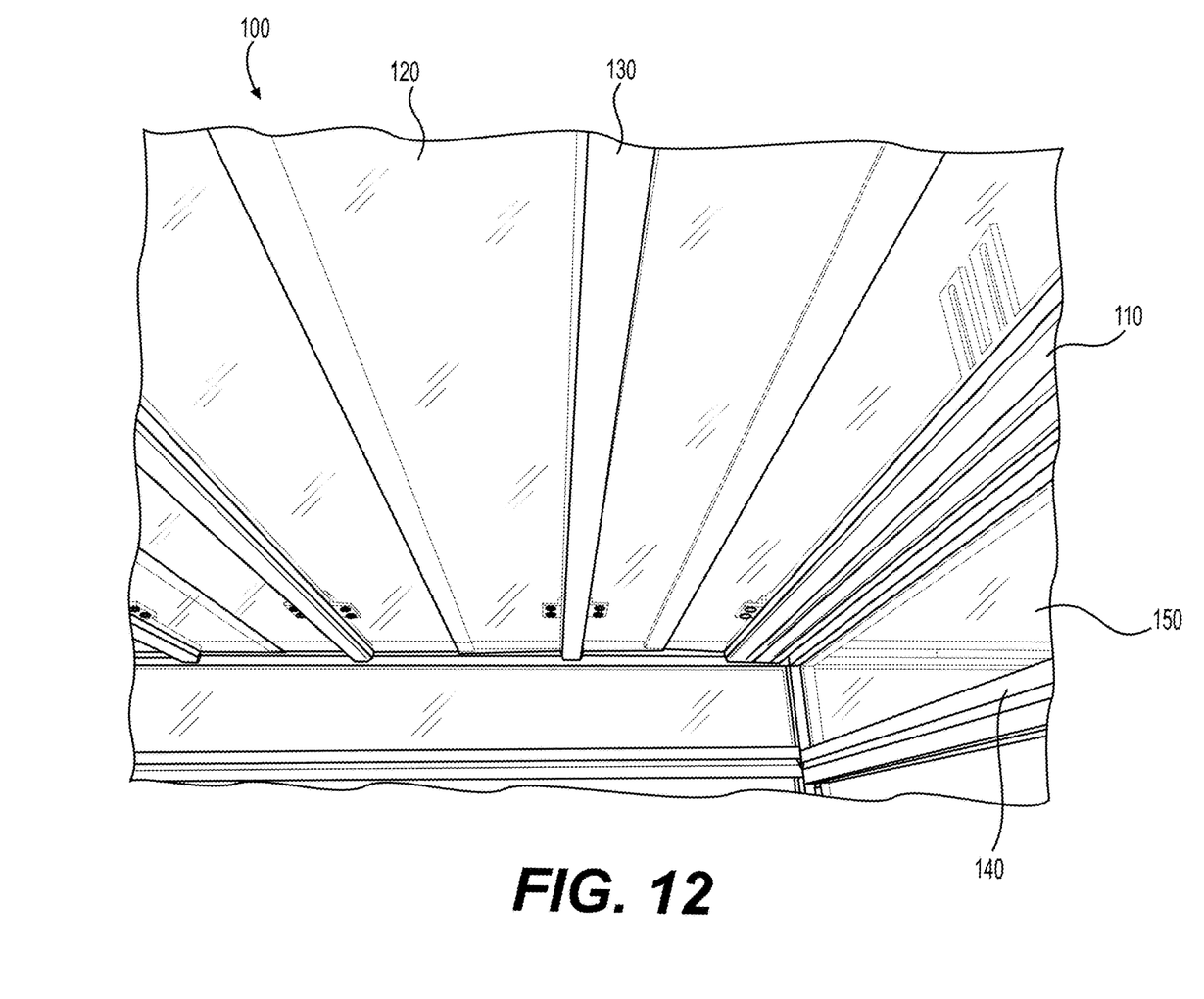
FIG. 12 illustrates panels of the roof system in their closed positions.

FIG. 12 illustrates a roof system 100 including a perimeter frame 110, a plurality of roof panels 120, each roof panel 120 having a cross-member 130, a riser frame 140 and a riser panels 150. The roof panels 120 are shown in their closed and overlapping positions. The cross-member 130 may be attached to the respective roof panel 120 by fasteners, such as screws, bolts, or the like.

As discussed above, FIG. 13 is a side schematic cross-sectional view of the interaction between the roof panels 120 in their closed positions, the interaction between the first roof panel 120-1 and the hold/release mechanism 160, and the interaction between a sixth roof panel 120-6 and the perimeter frame 110. The roof panels 120 of FIG. 13 may be alternately arranged, such that the shorter sides of adjacent roof panels 120 meet and the longer sides of adjacent roof panels meet. Further, a first roof panel 120-1 is held in its closed position by the hold/release mechanism 160. For instance, the first roof panel 120-1 may be comprised of a magnetic material, such as iron, or may have a magnetic component (such as a magnetic strip) at its connection with the hold/release mechanism 160, and the hold/release mechanism 160 may be an electromagnet. That is, a top surface of the first roof panel 120-1 may be held by magnetic attraction to the hold/release mechanism 160.

The first roof panel 120-1 of FIG. 13 may have a shorter end (or end that weighs less as described above) overlapping a shorter end (or end that weighs less as described above) of a second adjacent roof panel 120-2. The second roof panel 120-2 may have a longer end (or end that weighs more as described above) overlapped by a longer end of a third adjacent roof panel 120-3. The third roof panel 120-3 may have a shorter end overlapping a shorter end of a fourth roof panel 120-4. The fourth roof panel 120-4 may have a longer end overlapped by a longer end of a fifth roof panel 120-5. The fifth roof panel 120-5 may have a shorter end overlapping a shorter end of a sixth roof panel 120-6, and the longer end of the sixth roof panel 120-6 may abut against a stop, such as a lower side of the perimeter frame 110. This is one example of an arrangement with six roof panels 120, but a similar arrangement can be used with any even number of roof panels 120.

As shown in FIG. 14, in an arrangement with an odd number of roof panels 120, the shorter end of the last roof panel 120, such as the fifth roof panel 120-5, may abut against a stop, such as an upper side of the perimeter frame 110.

As shown in FIGS. 13 and 14, where the first roof panel 120-1 is arranged with a shorter side overlapping the second roof panel 120-2, the hold/release mechanism 160 may be arranged at the upper side of the longer side of the first roof panel 120-1. However, where the first roof panel 120-1 is arranged with a longer side supporting the second roof panel 120-2 as shown in FIG. 15, the hold/release mechanism 160 may be arranged at the lower side of the shorter side of the first roof panel 120-1.

Each roof panel 120 may pivot about a pivot point, where the pivot point may include a rotation member 116 connected to the perimeter frame 110 by a fastener, such as a bolt or screw. Each rotation member 116 may be a pin, a bearing, or the like.

Alternatively, each roof panel 120 may be provided without a panel frame and may be directly connected to the perimeter frame 110 by a pin, a bearing or the like.

The roof panels 120 may be installed in an alternating pattern, to allow the setting/arming of the roof panels 120 in a concurrent or cascading manner, so that each roof panel 120 rotatably holds the previous panel in place. When the first roof panel 120-1 (which is adjacent to the hold/release mechanism 160 at the end of the perimeter frame 110), is rotated, the first roof panel 120-1 is held in the closed position by the hold/release mechanism 160 to keep the CAC roof system 100 closed.

Each roof panel 120 of the roof system 100 may comprise any known material, including a polycarbonate, fiberglass, plastic, metal or wood; however, the roof system 100 is not limited to these materials.

The perimeter frame 110 may comprise various materials, such as metal or plastic, and may be any size, depending on the desired application. The sides of the perimeter frame 110 may provide continuous mounting points for the roof panels 120. That is, the roof panels 120 may be mounted to any longitudinal position of the perimeter frame 110 to allow for an entirety of a CAC to be covered by the roof panels 120.

The roof panels 120 may be attached to the perimeter frame by a pin, a bracket or fasteners, but the attachment is not limited to such as connection. Each roof panel 120 abuts against at least one adjacent roof panel 120, and each roof panel 120 overlaps or is overlapped by the at least one adjacent roof panel 120.

Each roof panel 120 may be connected to the perimeter frame 110 at the first end of the roof panel 120 and at the second end of the roof panel 120. The first end of the roof panel 120 may be a first longitudinal end and the second end of the roof panel 120 may be a second longitudinal end. Alternatively, each roof panel 120 may be directly connected to the perimeter frame 110.

The hold/release mechanism 160 may hold a first side of the first roof panel 120-1 via magnetic attraction, or by gravity. That is, the hold/release mechanism 160 may protrude inward towards the first roof panel 120-1 and towards an interior of the perimeter frame 110 to hold the first side of the first roof panel 120-1. Upon release of the hold/release mechanism 160, such as by user movement or by deactivation/release of an electromagnet, the first roof panel 120-1 may be released from the hold/release mechanism 160. The hold/release mechanism 160 may be an electromagnet that attaches to a magnetic material affixed to the first roof panel 120-1 when the first roof panel 120-1 is in a closed position, and that releases attachment to the magnetic material upon deactivation/release of the electromagnet.

The first roof panel 120-1 may overlap a second roof panel 120-2, which is directly adjacent to the first roof panel 120-1, and may rest against a surface of the first roof panel 120-1, such as a bottom surface of the first roof panel 120-1, to be held in its closed position. That is, the first roof panel 120-1 overlaps and contacts a portion of the second roof panel 120-2 to hold the second roof panel 120-2 in its closed position.

The second roof panel 120-2 may be overlapped by the first roof panel 120-1 and a third roof panel 120-3, the third roof panel 120-3 being directly adjacent to the second roof panel 120-2. The third roof panel 120-3 may rest on the second roof panel 120-2, which holds the third roof panel 120-3 in its closed position. The final roof panel 120, which may be the third roof panel 120-3, the fourth roof panel 120-4, the fifth roof panel 120-5 as shown in FIGS. 14 and 15, the sixth roof panel 120-6 as shown in FIG. 13, or whichever roof panel 120 is farthest from the first roof panel 120-1, may rest against a stop in its closed position, where the stop may be a top or bottom surface of the perimeter frame 110. Any number of roof panels 120 may be used.

Adjacent roof panels 120 may overlap and contact one another to form a seal. For example, the first roof panel 120-1 overlaps and contacts the second roof panel 120-2 to form a seal, the second roof panel 120-2 is overlapped by and contacts the third roof panel 120-3 to form a seal, the third roof panel 120-3 overlaps and contacts a fourth roof panel 120-4 to form a seal, and any further number of roof panels 120 may overlap and contact an adjacent roof panel 120 or the perimeter frame 110 of the roof system 100 to form a seal.

For instance, in the case of the roof system 100 being used in a CAC, the seal formed between adjacent roof panels 120, or a roof panel 120 and the perimeter frame 110, ensures the air conditioned air does not leak through the roof system 100, thereby improving cooling efficiency of the CAC.

The CAC system or HAC system may include a wiper extending downward from sides of the perimeter frame 110 to contact or meet up with a server cabinet or blanking roof panels. The perimeter frame 110 (i.e., roof frame) may be also mated to an end-of-row door system (i.e., end-of-aisle doors 20) to cap the end of the aisles.

Further, the perimeter frame 110 of the roof system 100 of the present invention may include a riser frame 140 extending downward from the perimeter frame. The riser frame 140 may abut against a top surface of one or more server cabinets 10 and may create a seal with the one or more server cabinets 10. The riser frame 140 may include riser panels 150 (i.e., side roof panels), as shown in FIG. 2.

If the roof system 100 is suspended from a ceiling of the data center, a wiper may be connected to the riser frame 140 and may extend from the riser frame 140 to a top surface of one of more server cabinets 10 to create a seal with the one or more server cabinets 10.

In response to a signal (such as a fire alarm or a smoke alarm), manual intervention, or the like to release the hold/release mechanism 160, the first roof panel 120-1 releases and rotates about the perimeter frame 110. Since the second roof panel 120-2 is held in its closed position by the first roof panel 120-1, release of the first roof panel 120-1 causes a release of the second roof panel 120-2. Further, since the third roof panel 120-3 is held in its closed position by the second roof panel 120-2, release of the second roof panel 120-2 causes release of the third roof panel 120-3. Further, additional roof panels 120 may be used in the roof system 100, and each additional roof panel 120 is subsequently released by the release of a preceding directly adjacent roof panel 120, caused by the release of the first roof panel 120-1. The roof panels 120 are thus released in a cascading manner.

The release of the roof panels 120 may include rotation of the roof panels 120 such that the roof panels 120 are oriented perpendicular to or substantially perpendicular to the floor, thus allowing, for example, water from a sprinkler system or other fire suppressant to enter into the CAC or HAC to suppress a fire or other hazard. That is, a sprinkler system or other type of fire suppression system may be provided above the roof system 100, and the release of the roof panels 120 may allow water or other material from the sprinkler system/fire suppression system to enter into the CAC or HAC to suppress a fire.

The roof system 100 of the present invention may permit the release of all of the roof panels 120 by the release of a single hold/release mechanism 160. However, the present invention is not limited thereto.

Alternatively, the roof system 100 of the present invention could also be used for many other purposes to include, but not limited to, emergency smoke ventilation, confetti drops, etc.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A roof system, comprising:
    a frame;
    a plurality of roof panels, wherein each roof panel is rotatable with respect to the frame; and
    a holding mechanism for holding a first roof panel among the plurality of roof panels in a closed position,
    wherein each roof panel has a center of mass and a center of rotation, wherein the center of mass is offset from the center of rotation to allow each roof panel to rotate after release of the holding mechanism, and wherein the center of rotation of each roof panel is fixed relative to the frame,
    wherein each roof panel among the plurality of roof panels overlaps or is overlapped by at least one adjacent roof panel among the plurality of roof panels,
    wherein release of the holding of the first roof panel by the holding mechanism allows each of the roof panels to rotate toward an open position, and
    wherein adjacent ones of the plurality of roof panels rotate in opposite directions toward the open position.

2. The roof system of claim 1, wherein each roof panel includes a cross-member extending along a length of the respective roof panel and connected to the frame, and
    wherein each roof panel is connected to the frame only by the respective cross-member.

3. The roof system of claim 2, wherein each cross-member is connected to a first side of the frame and a second side of the frame.

4. The roof system of claim 2, wherein each cross-member is connected to a first side of the frame and a second side of the frame by a rotation member, and
    wherein each roof panel is rotatable about the respective rotation member.

5. The roof system of claim 1, wherein each roof panel includes a weight spaced from the center of rotation of the respective roof panel.

6. The roof system of claim 1, wherein each roof panel has a first width extending from the center of rotation of the respective roof panel that is greater than a second width extending from the center of rotation of the respective roof panel, the second width extending in a direction opposite to the first width.

7. The roof system of claim 1, wherein each roof panel among the plurality of roof panels contacts the at least one adjacent roof panel to create a seal.

8. The roof system of claim 1, wherein the holding mechanism is one of the following: an electromagnet, a lever or a pin, and
    wherein the holding mechanism is positioned at one side of the roof system between the frame and the first roof panel.

9. The roof system of claim 1, wherein the holding mechanism is an electromagnet, and
    wherein the first roof panel is retained in the closed position by the electromagnet contacting a first end of the first roof panel.

10. The roof system of claim 1, wherein the holding mechanism is configured to directly hold the first roof panel among the plurality of roof panels in the closed position, to thereby maintain all of the plurality of roof panels in the closed position.

11. The roof system of claim 10, wherein the plurality of roof panels is configured to move toward the open position in a cascading manner starting from the first roof panel after release of the holding mechanism.

12. The roof system of claim 1, wherein each roof panel includes a cross-member extending along a length of the respective roof panel, the cross-member being connected to a first side of the frame by a first rotation member and connected to a second side of the frame by a second rotation member such that each respective roof panel is rotatable about the first rotation member and the second rotation member,
wherein the holding mechanism is an electromagnet,
wherein the plurality of roof panels includes:
the first roof panel having a first end and a second end, the first roof panel being retained in the closed position by the electromagnet contacting the first end of the first roof panel;
a second roof panel having a first end and a second end, the second end of the first roof panel overlying the first end of the second roof panel to retain the second roof panel in a closed position;
a third roof panel having a first end and a second end, the first end of the third roof panel overlying the second end of the second roof panel to retain the third roof panel in a closed position; and
a fourth roof panel having a first end and a second end, the second end of the third roof panel overlying the first end of the fourth roof panel to retain the fourth roof panel in a closed position, and
wherein the plurality of roof panels is configured to move toward the open position in a cascading manner starting from the first roof panel after release of the electromagnet.

13. A roof system, comprising:
a frame;
a plurality of roof panels, wherein each roof panel is rotatable with respect to the frame; and
a holding mechanism for holding a first roof panel among the plurality of roof panels in a closed position,
wherein each roof panel has a center of mass and a center of rotation, wherein the center of mass is offset from the center of rotation to allow each roof panel to rotate after release of the holding mechanism, and wherein the center of rotation of each roof panel is fixed relative to the frame,
wherein each roof panel among the plurality of roof panels overlaps or is overlapped by at least one adjacent roof panel among the plurality of roof panels,
wherein the plurality of roof panels includes:
the first roof panel having a first end and a second end; and
a second roof panel having a first end and a second end, wherein the second end of the first roof panel overlies the first end of the second roof panel to retain the second roof panel in a closed position, and
wherein adjacent ones of the plurality of roof panels rotate in opposite directions toward the open position.

14. The roof system of claim 13, wherein the plurality of roof panels further includes a third roof panel having a first end and a second end, wherein the first end of the third roof panel overlies the second end of the second roof panel to retain the third roof panel in a closed position.

15. The roof system of claim 13, wherein each roof panel includes a cross-member extending along a length of the respective roof panel and connected to the frame, and
wherein each roof panel is connected to the frame only by the respective cross-member.

16. The roof system of claim 15, wherein each cross-member is connected to a first side of the frame and a second side of the frame by a rotation member, and
wherein each roof panel is rotatable about the respective rotation member.

17. The roof system of claim 13, wherein each roof panel has a first width extending from the center of rotation of the respective roof panel that is greater than a second width extending from the center of rotation of the respective roof panel, the second width extending in a direction opposite to the first width.

18. The roof system of claim 13, wherein each roof panel among the plurality of roof panels contacts the at least one adjacent roof panel to create a seal.

19. The roof system of claim 13, wherein the holding mechanism is one of the following: an electromagnet, a lever or a pin,
wherein the holding mechanism is positioned at one side of the roof system between the frame and the first roof panel, and
wherein the holding mechanism is configured to directly hold the first roof panel among the plurality of roof panels in the closed position, to thereby maintain all of the plurality of roof panels in the closed position.

20. The roof system of claim 19, wherein the plurality of roof panels is configured to move toward the open position in a cascading manner starting from the first roof panel after release of the holding of the first roof panel by the holding mechanism.

* * * * *